United States Patent
Kostylev et al.

(10) Patent No.: US 6,914,801 B2
(45) Date of Patent: Jul. 5, 2005

(54) METHOD OF ELIMINATING DRIFT IN PHASE-CHANGE MEMORY

(75) Inventors: Sergey A. Kostylev, Bloomfield Hills, MI (US); Wolodymyr Czubatyj, Warren, MI (US); Tyler Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/437,134

(22) Filed: May 13, 2003

(65) Prior Publication Data

US 2004/0228159 A1 Nov. 18, 2004

(51) Int. Cl.⁷ .............................................. G11C 11/00
(52) U.S. Cl. .................. 365/148; 365/189.01; 365/113
(58) Field of Search ........................... 365/148, 185.24, 365/189.01, 100, 113

(56) References Cited

U.S. PATENT DOCUMENTS

| | | | | | |
|---|---|---|---|---|---|
| 5,357,465 | A | * | 10/1994 | Challa | 365/185.18 |
| 5,696,717 | A | * | 12/1997 | Koh | 365/185.22 |
| 5,912,839 | A | * | 6/1999 | Ovshinsky et al. | 365/185.03 |
| 6,141,241 | A | * | 10/2000 | Ovshinsky et al. | 365/163 |
| 6,272,669 | B1 | * | 8/2001 | Anderson et al. | 716/16 |
| 2003/0026132 | A1 | * | 2/2003 | Chen et al. | 365/185.18 |
| 2003/0156447 | A1 | * | 8/2003 | Kozicki | 365/151 |
| 2003/0209971 | A1 | * | 11/2003 | Kozicki | 313/498 |

* cited by examiner

Primary Examiner—Thong Q. Le
(74) Attorney, Agent, or Firm—Philip H. Schlazer; Marvin S. Siskind

(57) ABSTRACT

A method of operating a electrically programmable phase-change memory element. The method includes the step of applying an electrical signal to memory element which is sufficient to return the memory element to its pre-drift resistance state.

23 Claims, 5 Drawing Sheets

METHOD OF ELIMINATING DRIFT IN PHASE-CHANGE MEMORY

FIELD OF THE INVENTION

The present invention relates generally to electrically programmable phase-change memory. More specifically, the present invention relates to methods of eliminating drift in electrical programmable phase-change memory.

BACKGROUND OF THE INVENTION

The use of electrically programmable phase-change materials (for example, materials which can be electrically programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being electrically programmed between a first structural state having a where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

FIG. 1 is a plot of the resistance of a chalcogenide phase-change memory element versus the amplitude of a current pulse through the memory element. Referring to FIG. 1, several different programming regimes can be distinguished. In the left side of the curve, the resistance of the device remains substantially constant (i.e., in its high resistance or RESET state) until a current pulse of sufficient energy is applied. The device is then transformed from its high resistance (RESET) state to its low resistance (SET) state. The current pulse sufficient to program the memory element from the high resistance state to the low resistance state is referred to as a "set pulse". While not wishing to be bound by theory, it is believed that the set pulse is sufficient to change at least a portion of the volume of memory material from a less-ordered amorphous state to a more-ordered crystalline state.

The memory device may be programmed back from the low resistance state or SET state to the high resistance or RESET state by applying a current pulse of sufficient amplitude, referred to as a "reset pulse". While not wishing to be bound by theory, it is believed that application of a reset pulse to the memory element is sufficient to change at least a portion of the volume of memory material from a more-ordered crystalline state to a less-ordered amorphous state. The memory device may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 1, as the amplitude of the current through the memory element increases, the resistance of the device increases. This increase is both gradual and reversible. In this regime, the phase-change memory element may be programmed to any resistance value within a window of resistance values bounded by the low resistance or SET state and the high resistance or RESET state. More specifically, in this regime along the right side of the curve, the phase-change memory element may be programmed from any one of the resistance states on the right side of the resistance curve to any other of the resistance states on the right side of the curve by the application of a current pulse of sufficient amplitude. The device may thus be programmed between three or more resistance values within the resistance window so as to provide for multi-state, directly overwritable data storage. While not wishing to be bound by theory, it is believed that each of the resistance states along the right side of the curve may correspond to a particular ratio of the volume of crystalline material to the volume of amorphous material in an active region of the phase-change material. Three intermediate resistance states R1, R2 and R3 are shown in the resistance curve of FIG. 1.

After a phase-change memory element is programmed to a particular resistance state (for example, this may be the low resistance or SET state, high resistance or RESET state, or some intermediate state between the SET/RESET states such as R1, R2 or R3), the particular resistance value of the resistance state may drift over time. Such drift may create a problem in distinguishing one resistance state from another, especially when the memory device is operated in a multi-state mode. While not wishing to be bound by theory, it is believed that this drift may be due to mechanical stresses caused by the programming of the device as well as the release of these mechanical stresses. A method of operating the memory device is needed which can eliminate the effects of this drift.

SUMMARY OF THE INVENTION

One aspect of the present invention is a method of operating an electrically programmable, phase-change memory element, the memory element programmable to a plurality of resistance states, the method comprising the step of: applying an electrical signal to the memory element, the electrical signal being insufficient to program the memory element from any of the resistance states to another of second of the resistance states, the electrical signal sufficient to provide a voltage across the memory element having a magnitude which is greater than or equal to the magnitude of the threshold voltage of the memory element.

Another aspect of the present invention is a method of reading an electrically programmable, phase-change memory element, the method comprising the steps of: applying a first electrical signal to the memory element, the first electrical signal causing a first voltage across the memory element, the first voltage having a magnitude greater than or equal to the magnitude of the threshold voltage of the memory element; and applying a second electrical signal to the memory element, the second electrical signal causing a second voltage across the memory element, the second voltage having a magnitude less than the magnitude of the threshold voltage of the memory element.

Another aspect of the invention is a method of operating an electrically programmable, phase-change memory element, the memory element programmable to a plurality of resistance states, the method comprising the step of:

applying an electrical signal to the memory element, the electrical signal being insufficient to program the memory element from any one of the resistance states to any other of the resistance states, the electrical signal sufficient to switch the memory element from its OFF state to its ON state.

DETAILED DESCRIPTION OF THE INVENTION

Disclosed herein is a novel method of operating a phase-change memory element. The novel method comprises the step of applying an electrical signal to the memory element. The electrical signal is sufficient to cause a voltage across the memory element having a magnitude which is greater than magnitude of the threshold voltage of the element. However, the electrical signal is insufficient to program the memory element from any one of its resistance states to any other of its resistance states. The electrical signal may be applied as a controlled current (such as from a current source) or as a controlled voltage (such as from a voltage source). It is noted that as used herein the terminology "memory element" and "memory device" are synonymous and are used interchangeably.

As noted above, a chalcogenide phase-change memory element may be programmed to different resistance states. Associated with a chalcogenide phase-change memory element in a particular resistance state is a current-voltage, or "I-V", characteristic curve. The I-V characteristic curve describes the relationship between the current through the memory device as a function of the voltage across the device. In addition, the I-V characteristic curve describes the electrical switching behavior of the memory element in its particular resistance state as the voltage across the device is increased.

Figure 2:
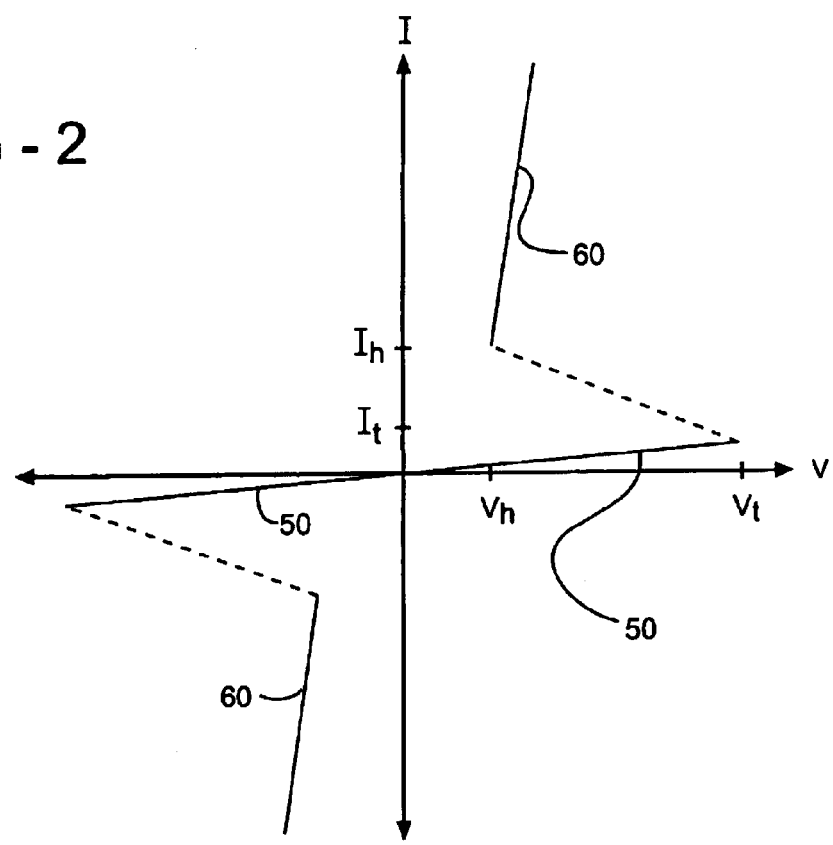
FIG. 2 is an example of a current-voltage characteristic curve for a chalcogenide-based phase-change memory element.

An example of an I-V characteristic curve for a chalcogenide memory element in a particular resistance state is shown in FIG. 2. FIG. 2 shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative).

The I-V characteristic curve IV includes an "off-state" branch 50 and an "on-state" branch 60. The off-state branch 50 corresponds to the branch in which the current passing through the memory device increases slightly upon increasing the voltage applied across the memory device. This branch exhibits a small slope in the I-V plot and appears as a nearly horizontal line in the first (and third) quadrant of FIG. 2. The on-state branch 60 corresponds to the branch in which the current passing through the memory device increases significantly upon increasing the voltage applied across the memory device. The magnitude of the slope of the on-state branch is greater than the magnitude of the slope of the off-state branch. In the example shown in FIG. 2, the on-state branch exhibits a large slope in the I-V plot and appears as a substantially vertical line in the first (and third) quadrant of FIG. 2. The slopes of the off-state and on-state branches shown in FIG. 2 are illustrative and not intended to be limiting. Regardless of the actual slopes, the on-state branch exhibits a steeper slope than the off-state branch. When conditions are such that the current through the device and voltage across the device is described by a point on the off-state branch of the I-V curve, the memory device is said to be in the "OFF" state. Likewise, when conditions are such that the current through the device and voltage across the device is described by a point on the on-state branch of the I-V curve, the memory device is said to be in the "ON" state.

The switching properties of the memory element (in a particular resistance state) can be described by reference to FIG. 2. When no voltage is applied across the device, the device is in the "OFF" state and no current flows. This condition corresponds to the origin of the I-V plot shown in FIG. 2 (current=0, voltage=0). The memory element remains in the OFF state as the voltage across the memory element and the current through the memory element is increased, up to a voltage $V_t$ which is referred to as the "threshold voltage" of the memory element. When the voltage across the memory element is less than $V_t$, the slope of the off-state branch of the I-V curve is small and the current flowing through the memory element increases only in a small amount as the applied voltage is increased.

When the applied voltage across the device equals or exceeds the threshold voltage $V_t$, the memory device switches from the off-state branch 50 to the on-state branch 60 of the I-V curve. The switching event occurs instantaneously and is depicted by the dashed line in FIG. 2. Upon switching, the voltage across the device decreases significantly and the current through the device becomes much more sensitive to changes in the device voltage (hence, branch 60 is steeper than branch 50). The memory device remains in the on-state branch 60 as long as a minimum current, labeled $I_h$ in FIG. 2, is maintained. $I_h$ is referred to as the holding current of the memory device and the associated voltage $V_h$ is referred to as the holding voltage of the memory device. If the memory element conditions are changed so that the current becomes less than $I_h$, the memory element normally returns to the off-state branch 50 of the I-V plot and requires re-application of a voltage which is greater than or equal to the threshold voltage $V_t$ to resume operation on the on-state branch. If the current is only momentarily (a time less than the recovery time of the chalcogenide material) reduced below $I_h$, the ON state of the memory element may be recovered upon restoring the current through the memory element which is at or above $I_h$. The recovery time of devices made with chalcogenide materials has been discussed in the article "Amorphous Semiconductors for Switching, Memory, and Imaging Applications" incorporated by reference herein.

Analogous switching behavior occurs in the third quadrant of the I-V plot shown in FIG. 2. Provided one is aware of the negative polarities of both the voltage and current of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the off-state branch 50 to the on-state branch 60.

Hence, as described above, the memory element may be switched from an OFF state to an ON state by application of a voltage across the memory element having a magnitude which is greater than or equal to the magnitude of the threshold voltage $V_t$. While not wishing to be bound by theory, it is believed that application of a voltage across the memory element which is at or above the threshold voltage may cause the formation of a conductive channel or filament within the chalcogenide memory material. At the threshold voltage $V_t$, the electric field experienced by the chalcogenide material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material more conductive and establishes an "ON" state. The creation of a conductive filament is the event that underlies the switching of the chalcogenide memory element from its OFF state to its ON state.

The current-voltage (I-V) characteristics of a memory element, including the threshold voltage $V_t$, is dependent upon the resistance state of the memory element. As the memory element is programmed to different resistance states, the I-V characteristics as well as the associated threshold voltage will change. (As noted above, each resistance state may correspond to a different ratio of crystalline to amorphous material in an active portion of the chalcogenide memory material of the memory element. As the ratio of crystalline to amorphous material changes, so does the corresponding current-voltage characteristics and threshold voltage of the memory element).

Figure 3:
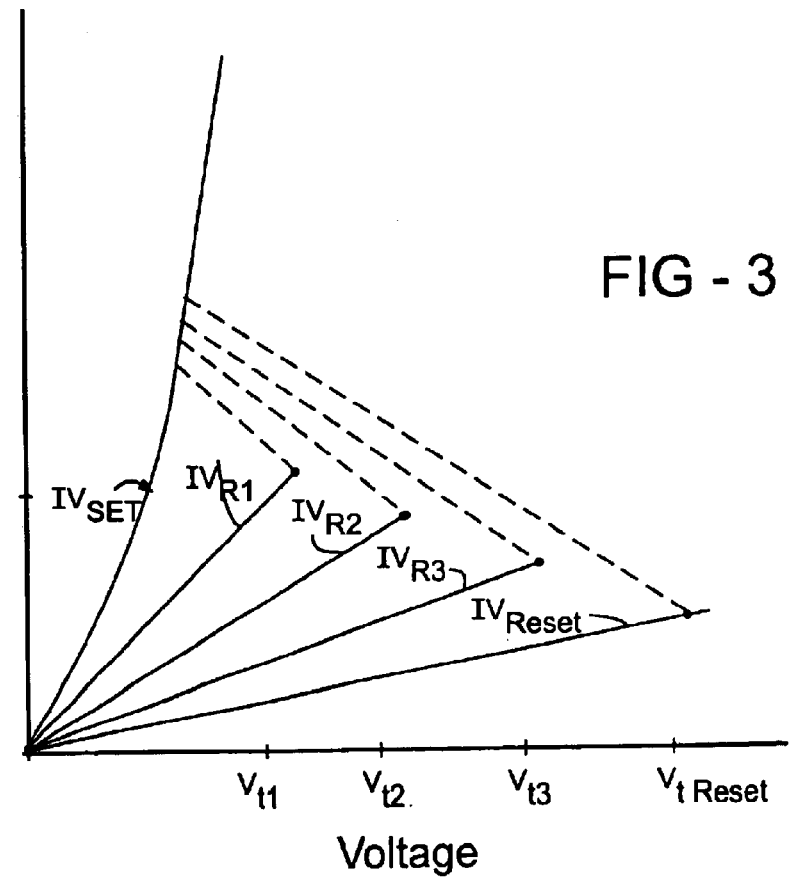
FIG. 3 is an example of a family of current-voltage characteristic curves for a chalcogenide-based phase-change memory element.

Associated with a memory element is a family of I-V curves where each curve corresponds to a particular resistance state of the memory element. An example of a family of I-V curves is shown in FIG. 3. FIG. 3 shows an I-V curve $IV_{SET}$ that describes the current-voltage characteristics of the device in its low resistance or SET state as well as I-V curve $IV_{RESET}$ that describes the current-voltage characteristics of the device in its high resistance or RESET state.

Figure 1:
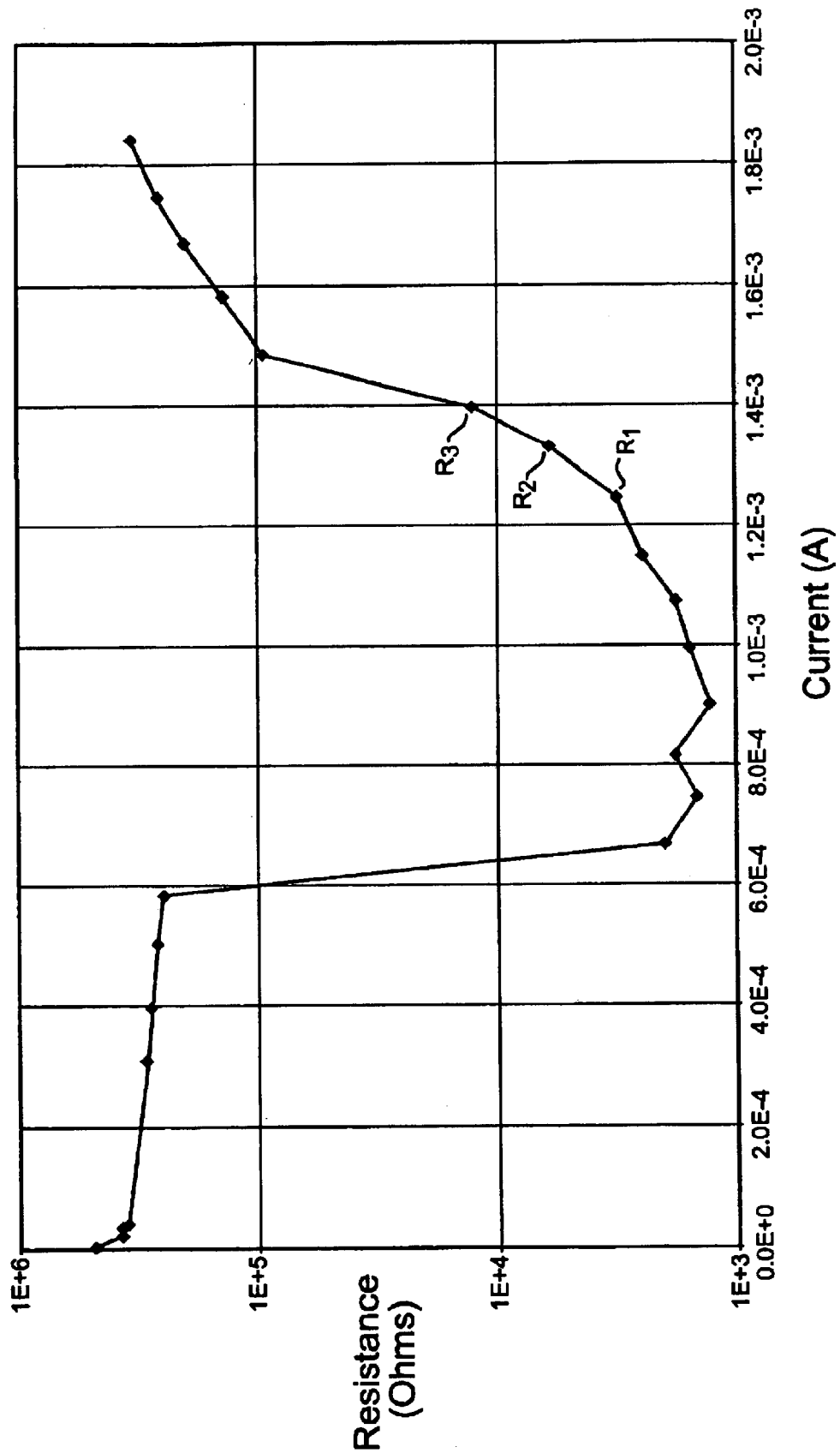
FIG. 1 shows an example of a resistance curve of a chalcogenide-based phase-change memory element.

FIG. 3 also shows I-V curves $IV_{R1}$, $IV_{R2}$ and $IV_{R3}$ describe the current-voltage characteristics for the device in its resistance states R1, R2 and R3, respectively, along the right hand side of the resistance curve shown in FIG. 1 (where R3 resistance>R2 resistance>R1 resistance>SET resistance). As seen from FIG. 3, a threshold voltage $V_t$ exists for each resistance state of the device except for the SET state. In addition, it is seen that the threshold voltage $V_t$ varies with the resistance state so that a different threshold voltage $V_{t1}$, $V_{t2}$, $V_{t3}$, $V_{tRESET}$ corresponds to a respective resistance state R1, R2, R3 and RESET. As shown in FIG. 3, the threshold voltage $V_t$ increases with increasing resistance of the resistance state. The I-V characteristic curves shown in FIG. 3 are symmetric with respect to the polarity of the applied voltage (that is, negative voltages cause negative currents). However, for convenience, only the first quadrant (where voltages and currents are positive) of the I-V plots are shown.

The threshold voltage $V_t$ of the device is thus dependent upon the actual resistance state of the device. In addition, the threshold voltage $V_t$ may also depend upon other factors such as the thickness of the memory device as well as the actual chalcogenide composition used.

The inventors of the present invention have discovered that switching the memory element from its OFF state to its ON state is sufficient to reverse the effects of resistance drift and return the memory element to its pre-drift programmed resistance state. As noted above, the device may be switched by the application of a voltage across the memory element having a magnitude which greater than or equal to the magnitude of the threshold voltage of the memory element. Hence, the memory device may be forced to return to its pre-drift resistance state by application of a voltage across the memory element having a magnitude which is greater than or equal to the threshold voltage of the memory element. This voltage is referred to as the "drift recovery" voltage $V_{DR}$.

It is believed that programming a memory element from one resistance state to another resistance state may introduce a stress into the memory element and that the relaxation of this stress that may cause resistance drift. While not wishing to be bound by theory, it is believed that switching the memory element from its OFF state to its ON state may reintroduce stress into the memory element so as to force the memory element to return to its pre-drift resistance state.

A voltage $V_{DR}$ having a magnitude greater than or equal to the magnitude of the threshold voltage may be applied across the memory element by applying an appropriate electrical signal to the memory element. The electrical signal may be a controlled voltage signal (such as from a voltage source). For example, the electrical signal may be in the form of a Controlled voltage pulse from a voltage source where the controlled voltage pulse has an amplitude $V_{DR}$ greater than or equal to the amplitude of the threshold voltage.

Alternately, the electrical signal may be in the form of a controlled current (such as from a current source) directed through the memory element. For example, the electrical signal may be in the form of a controlled current pulse from a current source where the controlled current pulse has an amplitude which is greater than or equal to the magnitude of current needed to cause the voltage across the memory element to reach the threshold voltage $V_t$. The magnitude of current needed to cause the voltage across the memory element to reach the threshold voltage is shown in FIG. 2 as the current $I_t$.

Regardless of the form of the electrical signal applied to the memory device, the electrical signal used for drift recovery should preferably be insufficient to program the memory element away from its present resistance state to any other resistance state. Hence, the current through the memory element as a result of this electrical signal should preferably be insufficient to program the memory element from any one of the resistance states of the memory element to any other of the resistance states of the memory element. Preferably, the current through the memory element as a result of the applied drift recovery electrical signal has a magnitude which is less than about one-third of the magnitude of the current needed to program the memory element to another resistance state. The magnitude of the current is preferably less than about one-third the current needed to program the memory element to its low resistance or SET state. As an example, for certain memory elements, it is possible that a current through the memory element having a magnitude between about 5 micro-amps and about 20 micro-amps may be sufficient to reverse the effects of resistance drift.

The drift recovery electrical signal applied to the memory element for reversing the effects of resistance drift is preferably in the form of a pulse with a finite pulse width. The width of the pulse is preferably greater than about 5 nanoseconds. More preferably, the width of the pulse is between about 5 nanoseconds and about 20 nanoseconds. However, other widths are also possible and the present invention is not limited to any particular width. The actual width used may depend upon the width of the read pulse used to actually read the resistance of the memory element. Preferably, the width of the drift recovery pulse is less than the width of the read pulse used for reading the resistance of the memory element. In addition, the drift recovery pulse may have any shape. For example, it may have a substantially constant amplitude (such as a square pulse). Alternately, it may have a varying amplitude.

Hence, by applying an electrical signal to the memory element that (1) returns the device to its pre-drift condition and (2) does not program the device to a different resistance state, it thus becomes possible to then accurately read the resistance state of the device whether the device is operating in a binary mode (for example, by being programmed back and forth between its low resistance state and high resistance state) or whether the device is operating in a multi-state mode (for example, by being programmed between three or more resistance states along the right side of the resistance curve shown in FIG. 1).

The device may be read by applying a controlled voltage across the device (such as from a voltage source) having a magnitude which is preferably below the magnitude of the threshold voltage of the device and then measuring the current through the device. The lower the measured current, the higher the resistance state of the device. Alternately, the device may be read by applying a controlled current through the device (such as from a current source) and measuring the voltage across the device.

Figure 4A:
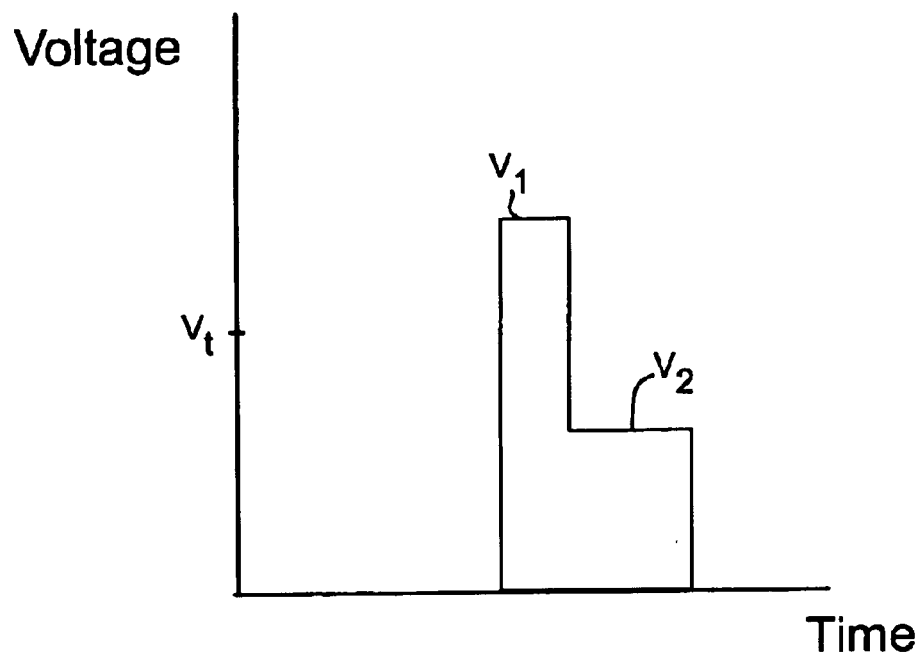
FIG. 4A is an example of a dual voltage scheme for reading the resistance state of a phase-change memory element.
Figure 4B:
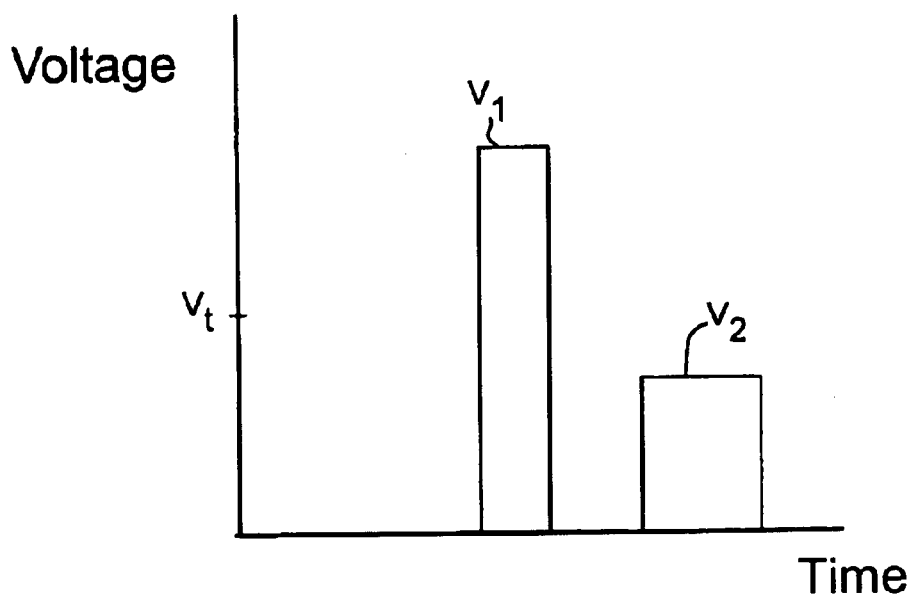
FIG. 4B is an example of a dual voltage scheme for reading the resistance state of a phase-change memory element.

Hence, a possible scheme for accurately reading the resistance state of the device may thus be to apply a first voltage $V_1$ across the device which is at least as large as the device threshold voltage so as to cause the device to return to its pre-drift resistance state. The corresponding current through the memory element should be insufficient to program the device from its present resistance state to a different resistance state. This first voltage $V_1$ is followed by a second voltage $V_2$ which is less than the threshold voltage $V_t$ of the device. This second voltage $V_2$ will actually be used to measure the resistance state of the device. An example of this dual voltage scheme is shown in FIGS. 4A and 4B. In FIG. 4A, a second voltage $V_2$ immediately follows the first voltage $V_1$. In FIG. 4B, the application of a second voltage pulse $V_2$ follows the end of a first voltage pulse $V_1$. Preferably, any delay between a first and a second voltage pulse should be sufficiently small so that drift in the resistance state does not re-occur to any significant extent. As noted above, the duration of the first voltage pulse $V_1$ (the drift recovery pulse) is preferably less than the duration of the second voltage pulse $V_2$ (the read pulse).

Figure 5A:
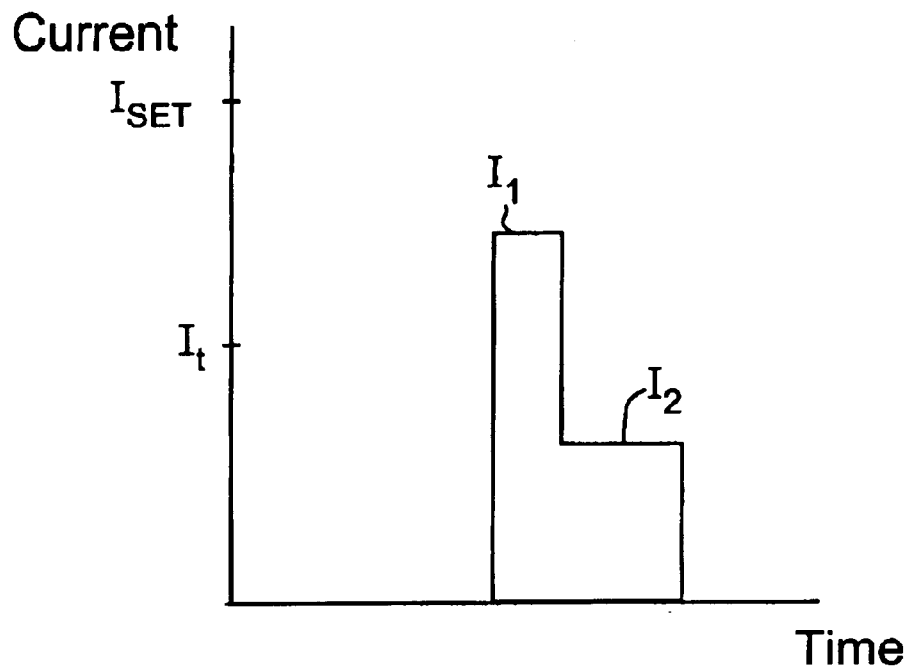
FIG. 5A is an example of a dual current scheme for reading the resistance state of a phase-change memory element.
Figure 5B:
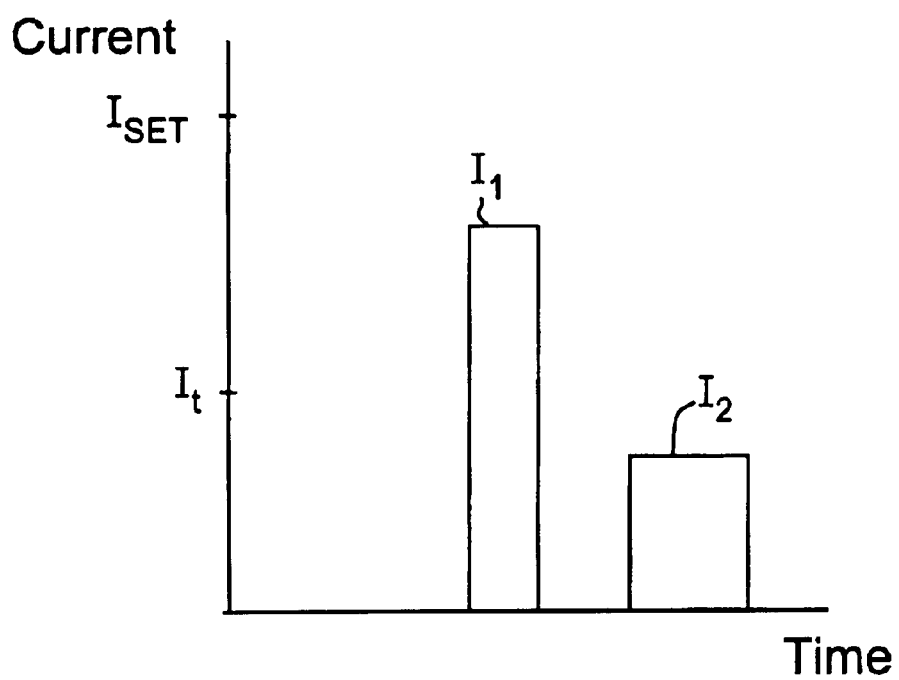
FIG. 5B is an example of a dual current scheme for reading the resistance state of a phase-change memory element.

A reading scheme may be described in terms of currents applied through the memory element. For example, a first current $I_1$ may be applied through the device which is greater than or equal to a current $I_t$ where $I_t$ is a current needed to create a threshold voltage $V_t$ across the device. However, $I_1$ should be less then a current which may program the device to another resistance state. The first current $I_1$ is used for drift recovery. That is, to force the device back to its pre-drift resistance state. This first current $I_1$ is followed by a second current $I_2$ which is less than $I_t$. This second current $I_2$ is used to actually measure the pre-drift resistance state of the memory element. That is, to read the value of the resistance state. For example, a known current $I_2$ may be applied through the memory element and the corresponding voltage across the memory element may then be measured. An example of this dual current scheme is shown in FIGS. 5A and 5B. In FIG. 5A, a second current $I_2$ immediately follows the first current $I_1$. In FIG. 5B, the application of a second current pulse $I_2$ follows the first current pulse $I_1$. Preferably, any delay between the first and second current pulses should be sufficiently small so that drift in the resistance state does not re-occur to any significant extent. The duration of the first current pulse $I_1$ (the drift recovery pulse) is preferably less than the duration of the second current pulse $I_2$ (the read pulse).

EXAMPLE

Figure 6:
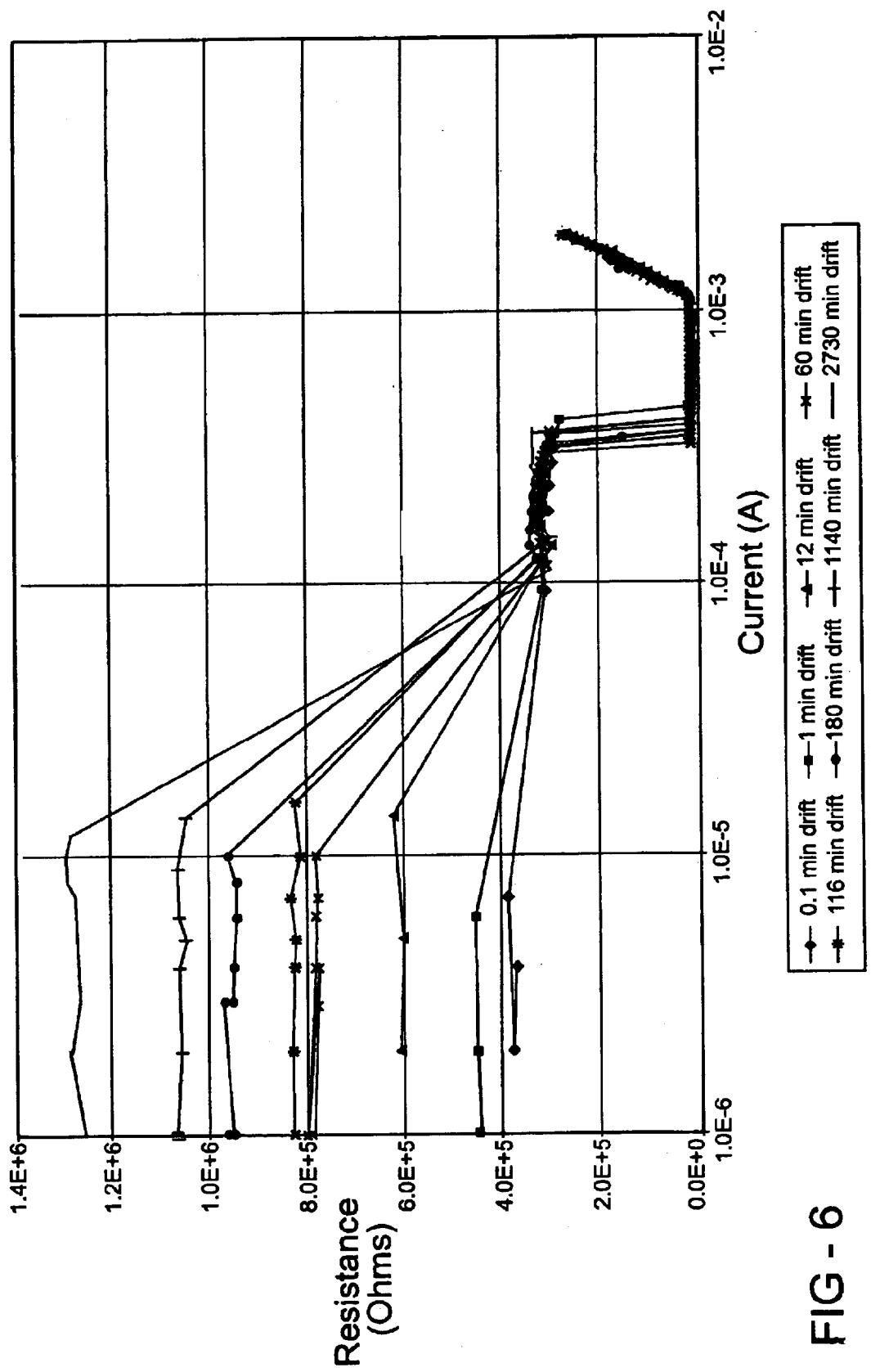
FIG. 6 is a plot showing that application of a current of sufficient amplitude to the memory element can cause the memory element to return to its pre-drift resistance value.

A programmable phase-change memory element having a memory material with the composition $Te_2Ge_2Sb_5$ is programmed to its high resistance or RESET state. The memory element resistance is allowed to drift for a time period of 0.1 minute. As shown in FIG. 6, the memory element drifts to a resistance that is greater than the resistance of the RESET state. A current having an amplitude of about 8 micro-amps is directed through the memory element which causes the memory element to return to its pre-drift RESET resistance value. The same experiment is repeated whereby the resistance of the memory element is allowed to drift for progressively longer time periods of 1 minute, 12 minutes, 60 minutes, 116 minutes, 180 minutes, 1140 minutes, and 2730 minutes. As the period of drift time increases, the resistance of the memory element drifts to increasingly higher values. For each case, a current of approximately 8 to 12 micro-amps directed through the memory element is sufficient to return the memory element to its pre-drift resistance.

The present invention relates to phase-change memory elements. The phase-change memory element includes a phase-change memory material which is preferably formed from a plurality of constituent atomic elements. Preferably, the phase-change material includes one or more elements selected from the group consisting of Te, Se, Ge, Sb, Bi, Pb, Sn, As, S, Si, P, O and mixtures or alloys thereof. The phase-change material preferably includes at least one chalcogen element. Preferably, the at least one chalcogen element is selected from the group consisting of Te, Se and mixtures or alloys thereof. The at least one chalcogen element may be a mixture of Te and Se. Preferably, the memory material is a ternary Ge—Sb—Te alloy. An example of a phase-change material is the chalcogenide composition $Ge_2Sb_2Te_5$ The phase-change material may include at least one transition metal element. The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se. The phase-change materials which include transition metals are elementally modified forms of the phase-change materials in the Te—Ge—Sb ternary system. That is, the elementally modified phase-change materials constitute modified forms of the Ge—Sb—Te phase-change alloys. This elemental modification is achieved by the incorporation of transition metals into the basic Ge—Sb—Te ternary system, with or without an additional chalcogen element, such as Se.

In addition to a phase-change memory material, the memory element includes means for applying energy to the memory material. When the energy is electrical energy, the memory element may include one or more electrodes for supplying the electrical signal to the memory material. The shape of the electrodes as well as their positioning relative to the volume of memory material may be varied to form different device structures. As an example, the electrodes may include first and second electrodes positioned adjacent to the memory material.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of operating an electrically programmable, phase-change memory element, said memory element programmable to a plurality of resistance states, said method comprising the step of:
   applying an electrical signal to said memory element, said electrical signal being insufficient to change the ratio of the volume of crystalline material to the volume of amorphous material of said memory element, said electrical signal sufficient to cause a voltage across said memory element having a magnitude which is greater than or equal to the magnitude of the threshold voltage of said memory element.

2. The method of claim 1, wherein said electrical signal is from a current source.

3. The method of claim 1, wherein said electrical signal is from a voltage source.

4. The method of claim 1, wherein said electrical signal causes a current through memory element, said current having a magnitude less than about one-third the magnitude of current needed to program said memory element to said any other of said resistance states.

5. The method of claim 1, wherein said electrical signal causes a current through said memory element, said current having a magnitude less than one-third the magnitude of a current needed to program said memory element to its low resistance state.

6. The method of claim 1, wherein said phase-change element comprises at least one chalcogen element.

7. The method of claim 1, wherein said electrical signal is in the form of a pulse.

8. A method of reading an electrically programmable, phase-change memory element, said method comprising the steps of:
   applying a first electrical signal to said memory element, said first electrical signal causing a first voltage across said memory element, said first voltage having a magnitude greater than or equal to the magnitude of the threshold voltage of said memory element; and
   applying a second electrical signal to said memory element, said second electrical signal causing a second voltage across said memory element, said second voltage having a magnitude less than the magnitude of the threshold voltage of said memory element.

9. The method of claim 8, wherein said first electrical signal is insufficient to program said memory element from any one of its resistance states to any other of its resistance states.

10. The method of claim 8, wherein said first electrical signal causes a first current through said memory element, said first current having a magnitude less than one-third the magnitude of the current needed to program said memory element said any other of said resistance states.

11. The method of claim 8, wherein said first electrical signal is from a current source.

12. The method of claim 8, wherein said second electrical signal is from a current source.

13. The method of claim 8, wherein said first electrical signal is from a voltage source.

14. The method of claim 8, wherein said second electrical signal is from a current source.

15. The method of claim 8, wherein said first electrical signal is in the form of a pulse.

16. The method of claim 8, wherein said second electrical signal is in the form of a pulse.

17. The method of claim 8, wherein the duration of said second electrical signal is less than the duration of said first electrical signal.

18. The method of claim 8, wherein said first electrical signal and said second electrical signal are separated by a time period.

19. The method of claim 8, wherein said phase-change memory element comprises at least one chalcogen element.

20. A method of operating an electrically programmable, phase-change memory element, said memory element programmable to a plurality of resistance states, said method comprising the step of:
   applying an electrical signal to said memory element, said electrical signal being insufficient to change the ratio of the volume of crystalline material to the volume of amorphous material of said memory element, said electrical signal sufficient to switch said memory element from its OFF state to its ON state.

21. The method of claim 20, wherein said phase change element includes at least one chalcogen element.

22. A method of operating an electrically programmable, phase-change memory element including a phase-change material, comprising:
   applying an electrical signal to said memory element, said electrical signal sufficient to cause a voltage across said memory element having a magnitude which is greater than or equal to the magnitude of the threshold voltage of said memory element, said electrical signal insufficient to change the structural state of said phase-change material.

23. The method of claim 22, wherein said phase-change material comprises a chalcogen element.

* * * * *